United States Patent
Kobayashi et al.

(10) Patent No.: US 10,629,725 B2
(45) Date of Patent: Apr. 21, 2020

(54) SEMICONDUCTOR DEVICE HAVING SEMICONDUCTOR REGIONS WITH AN INTERVAL THEREBETWEEN IN A GATE PAD REGION

(71) Applicant: FUJI ELECTRIC CO., LTD., Kawasaki-shi (JP)

(72) Inventors: Yusuke Kobayashi, Tsukuba (JP); Manabu Takei, Tsukuba (JP); Shinsuke Harada, Tsukuba (JP); Naoyuki Ohse, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/167,756

(22) Filed: Oct. 23, 2018

(65) Prior Publication Data

US 2019/0165163 A1 May 30, 2019

(30) Foreign Application Priority Data

Nov. 29, 2017 (JP) .................. 2017-229698

(51) Int. Cl.
| | |
|---|---|
| *H01L 29/76* | (2006.01) |
| *H01L 29/78* | (2006.01) |
| *H01L 29/16* | (2006.01) |
| *H01L 29/66* | (2006.01) |
| *H01L 29/47* | (2006.01) |
| *H01L 29/08* | (2006.01) |
| *H01L 29/872* | (2006.01) |
| *H01L 29/06* | (2006.01) |

(52) U.S. Cl.
CPC ...... *H01L 29/7813* (2013.01); *H01L 29/0615* (2013.01); *H01L 29/0623* (2013.01); *H01L 29/086* (2013.01); *H01L 29/0878* (2013.01); *H01L 29/1608* (2013.01); *H01L 29/47* (2013.01); *H01L 29/66068* (2013.01); *H01L 29/7806* (2013.01); *H01L 29/872* (2013.01)

(58) Field of Classification Search
None
See application file for complete search history.

(56) References Cited

U.S. PATENT DOCUMENTS

| | | | |
|---|---|---|---|
| 5,614,749 A | 3/1997 | Ueno | |
| 6,262,453 B1 * | 7/2001 | Hshieh | H01L 29/0878 257/341 |
| 9,024,379 B2 * | 5/2015 | Darwish | H01L 29/7395 257/334 |
| 9,412,737 B2 * | 8/2016 | Saito | H01L 27/0716 |

(Continued)

FOREIGN PATENT DOCUMENTS

| | | |
|---|---|---|
| JP | 8-204179 A | 8/1996 |
| JP | 2014-017469 A | 1/2014 |
| JP | 2015-072999 A | 4/2015 |

*Primary Examiner* — Hung K Vu

(57) ABSTRACT

A vertical MOSFET having a trench gate structure includes an n⁻-type drift layer and a p-type base layer formed by epitaxial growth. In the n⁻-type drift layer, an n-type region, first p⁺-type regions, and a second p⁺-type region are provided. In a region opposing, in a depth direction, a gate electrode pad connected to a gate electrode, the first p⁺-type regions are provided with intervals therebetween along a width direction of the trench gate.

9 Claims, 16 Drawing Sheets

(56) References Cited

U.S. PATENT DOCUMENTS

| | | | |
|---|---|---|---|
| 2015/0115286 A1 | 4/2015 | Takeuchi et al. | |
| 2015/0340360 A1* | 11/2015 | Darwish | H01L 29/7395 257/329 |
| 2016/0247910 A1 | 8/2016 | Suzuki et al. | |
| 2016/0351560 A1* | 12/2016 | Miyake | H01L 27/0629 |
| 2017/0221714 A1* | 8/2017 | Wakimoto | H01L 29/66734 |

* cited by examiner

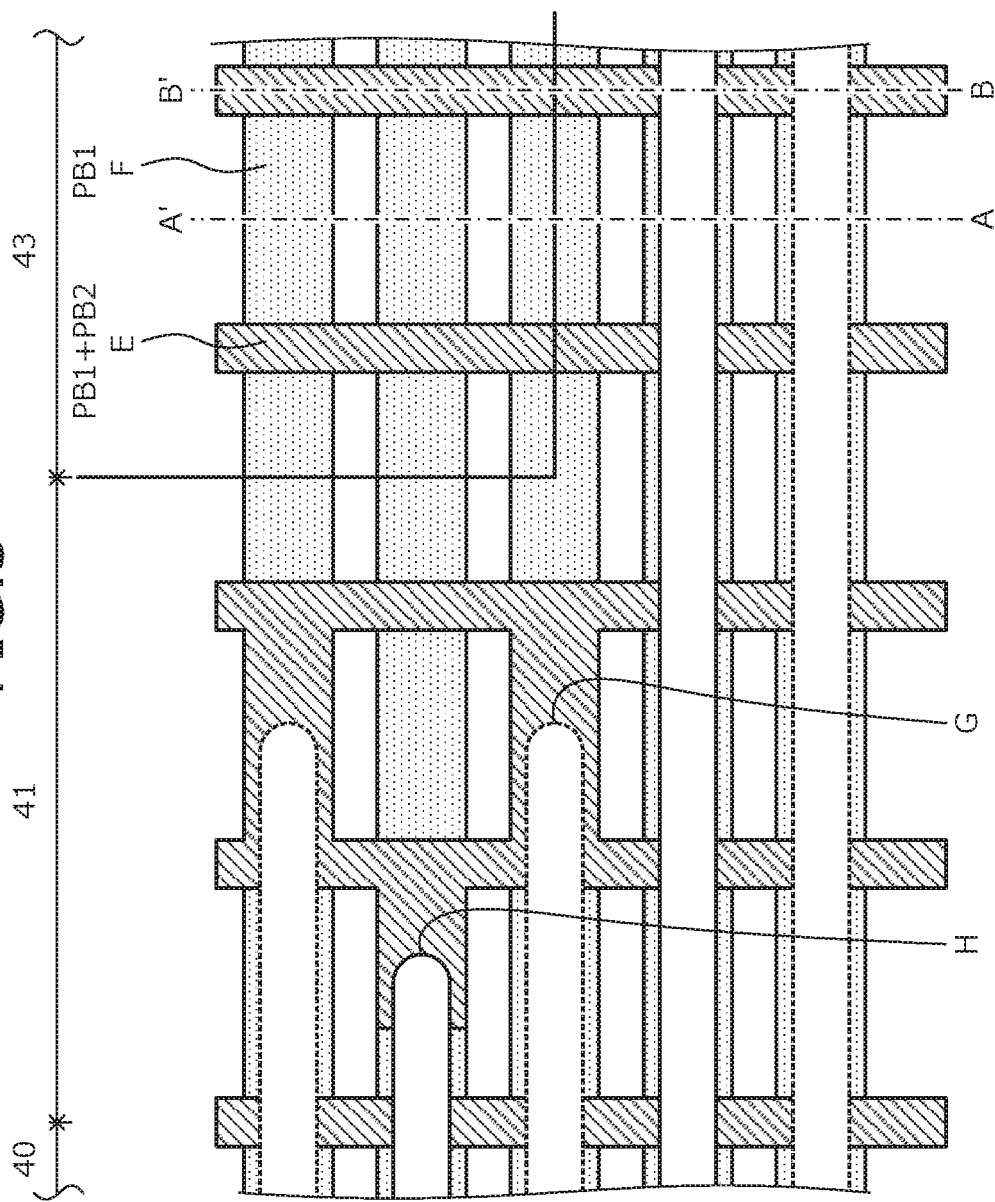

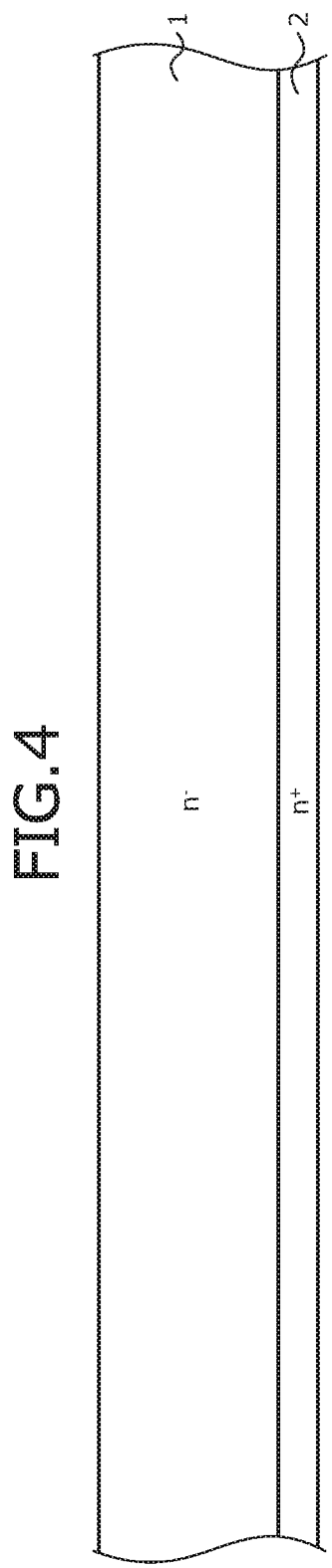

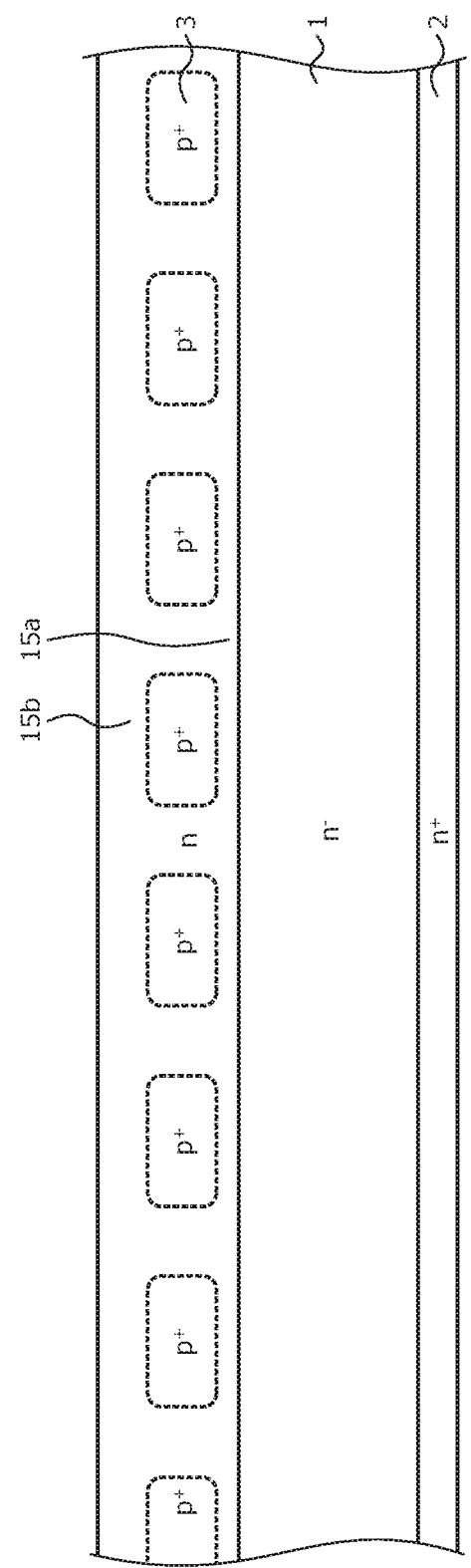

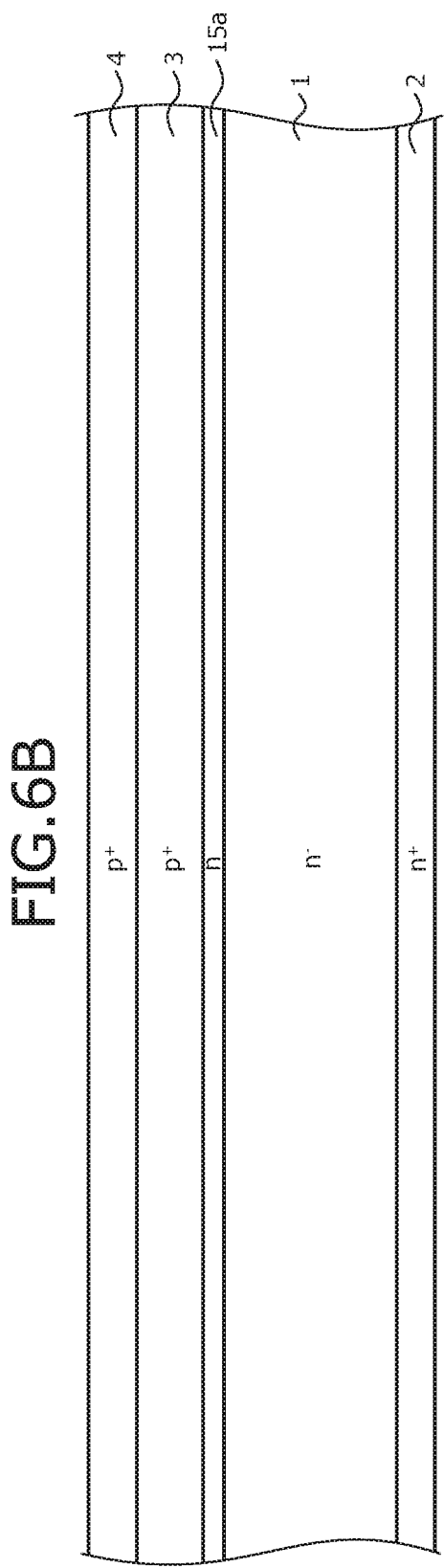

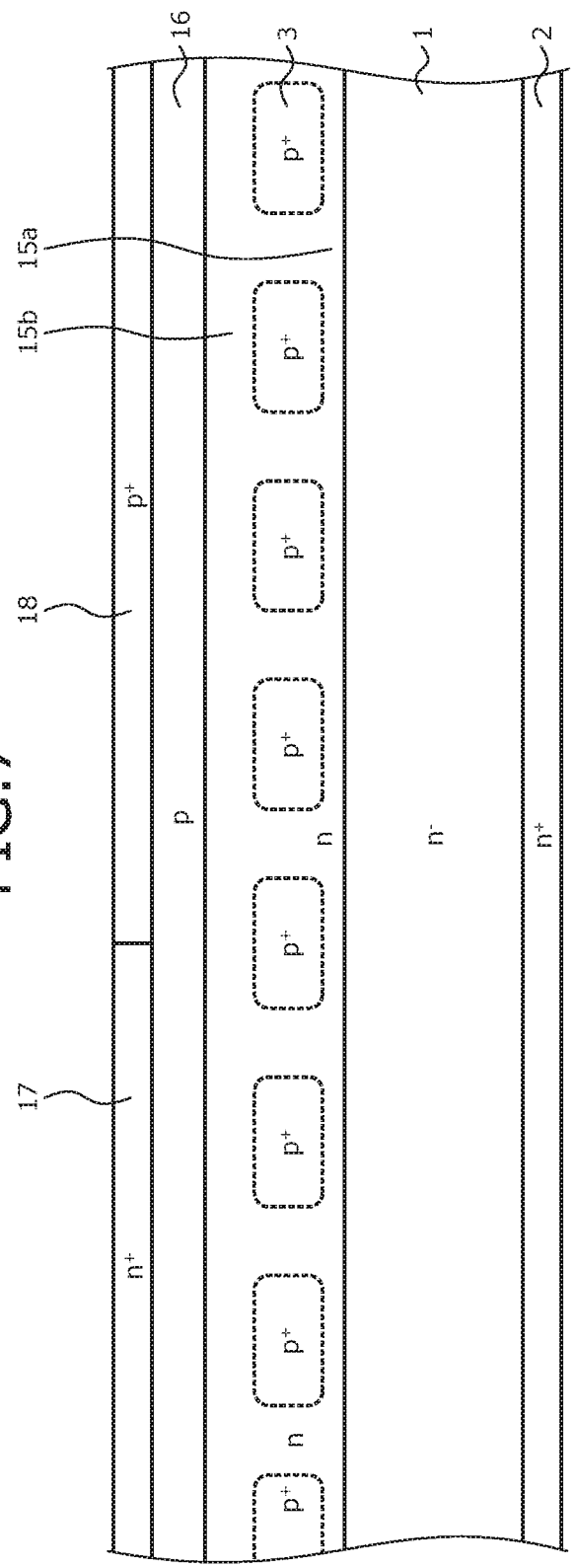

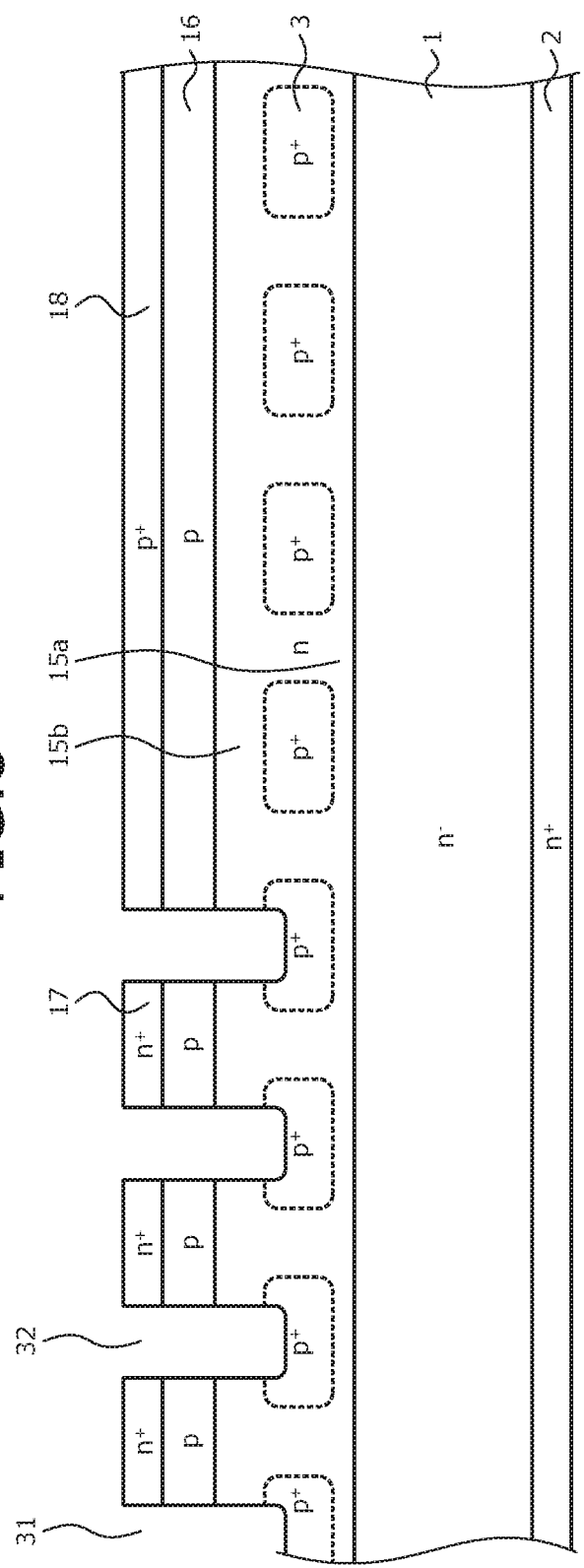

FIG. 9
RELATED ART

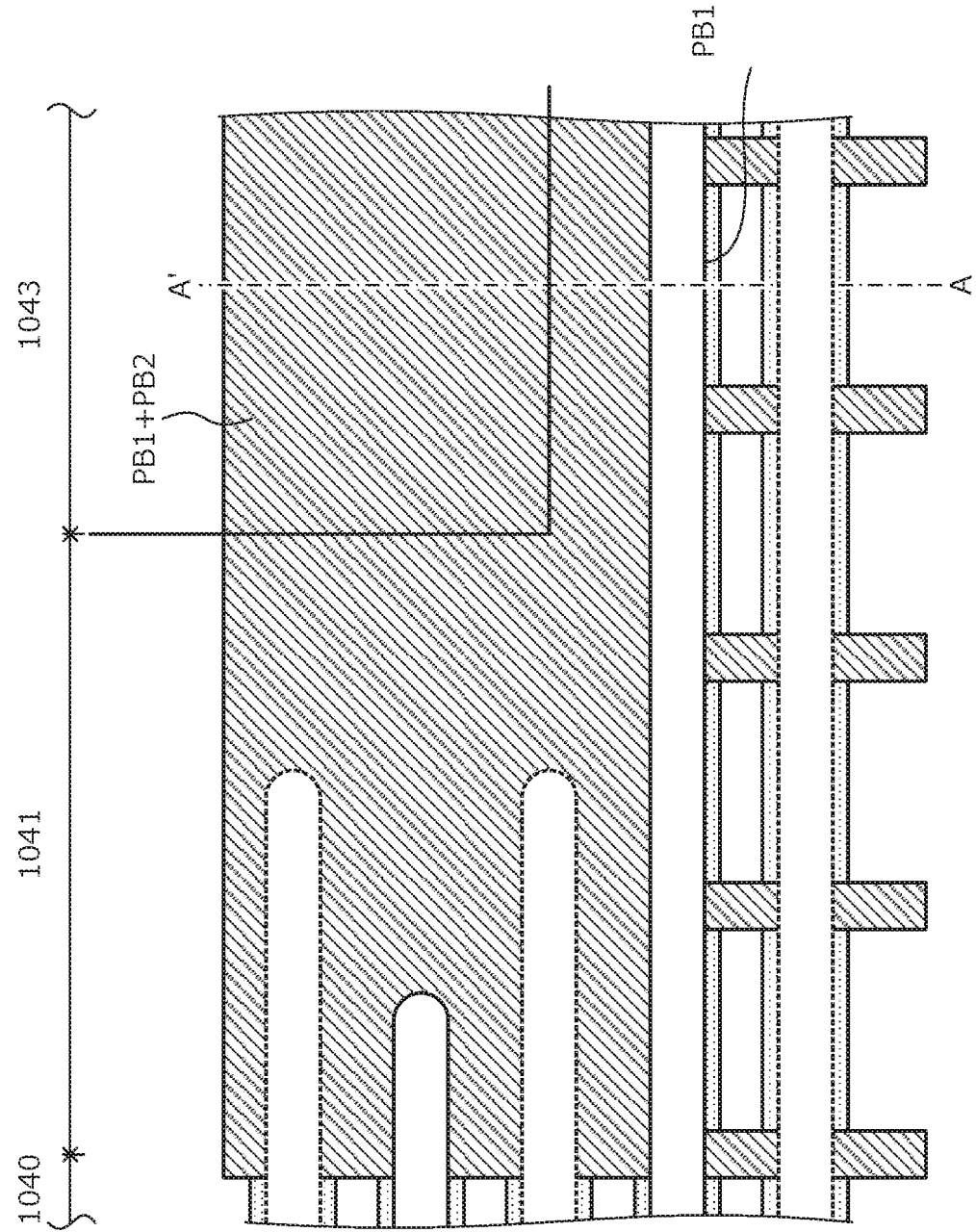

SEMICONDUCTOR DEVICE HAVING SEMICONDUCTOR REGIONS WITH AN INTERVAL THEREBETWEEN IN A GATE PAD REGION

CROSS REFERENCE TO RELATED APPLICATIONS

This application is based upon and claims the benefit of priority of the prior Japanese Patent Application No. 2017-229698, filed on Nov. 29, 2017, the entire contents of which are incorporated herein by reference.

BACKGROUND

1. Field

Embodiments of the invention relate to semiconductor device.

2. Description of Related Art

Conventionally, to reduce the ON resistance of an element in a power semiconductor device, a vertical metal oxide semiconductor field effect transistor (MOSFET) having a trench structure is produced (manufactured). In the vertical MOSFET, the trench structure in which a channel is formed orthogonal to a substrate surface enables the cell density per unit area to be increased to a greater extent as compared to a planar structure in which the channel is formed parallel to the substrate surface. Therefore, with the trench structure, the current density per unit area may be increased, which is advantageous from the perspective of cost.

Nonetheless, when the trench structure is formed in the vertical MOSFET, the structure is such that an entire region of the inner walls of the trench are covered by a gate insulating film to form a channel in an orthogonal direction. A portion of the gate insulating film at a bottom of the trench is near a drain electrode and therefore, this portion of the gate insulating film is easily subjected to high electric field. In particular, since ultrahigh voltage elements are produced with a wide bandgap semiconductor material (semiconductor material having a wider bandgap than that of silicon such as silicon carbide (SiC)), adverse effects on the gate insulating film at the bottom of the trench significantly reduce reliability.

As a method of solving such problems, a technique has been proposed in which in a vertical MOSFET having a trench structure that has a striped flat pattern, a p$^+$-type region is provided between trenches and has a striped shape parallel to the trenches; and a p$^+$-type region is provided at each trench bottom and has a striped shape parallel to the trenches (for example, refer to Japanese Laid-Open Patent Publication No. 2015-72999).

FIG. 9 is a cross-sectional view of a structure of a conventional silicon carbide semiconductor device. The conventional silicon carbide semiconductor device depicted in FIG. 9 includes a MOS gate having a general trench gate structure at a front surface (surface at which a p-type base layer 1016 is provided) side of a semiconductor base (hereinafter, silicon carbide base) 1100 that contains silicon carbide. The silicon carbide base (semiconductor chip) 1100 is formed by sequentially forming by epitaxial growth on an n$^+$-type starting substrate (hereinafter, n$^+$-type silicon carbide substrate) 102 that contains silicon carbide, silicon carbide layers constituting an n$^-$-type drift layer 101, an n-type region 1015 that is a current spreading region, and the p-type base layer 1016.

In the n-type region 1015, a first p$^+$-type region 103 is selectively provided so as to underlie a bottom of a trench gate 1031 entirely. The first p$^+$-type region 103 is provided at a depth not reaching the n$^-$-type drift layer 101. Further, in the n-type region 1015, the first p$^+$-type region 103 is selectively provided between (mesa part) adjacent trench gates 1031. The first p$^+$-type region 103 between the trench gates 1031 is provided so as to be in contact with the p-type base layer 1016. Reference numerals 1017, 1018, 1019, 1020, 1021, and 1022 are an n$^+$-type source region, a p$^+$-type contact region, a gate insulating film, a gate electrode, an interlayer insulating film, and a source electrode, respectively.

A vertical MOSFET has, as a body diode between a source and a drain, a built-in parasitic pn diode formed by a p-type base layer and n-type drift layer. Therefore, a free wheeling diode (FWD) used in an inverter may be omitted, contributing to lower costs and a smaller size. Nonetheless, when a silicon carbide substrate is used as a semiconductor substrate, the parasitic pn diode has high built-in potential as compared to a case where a silicon (Si) substrate is used and therefore, ON resistance of the parasitic pn diode increases and may lead to increased loss. Further, when the parasitic pn diode turns ON and is energized, characteristics vary overtime (aging) due to bipolar operation of the parasitic pn diode, whereby forward direction degradation and increases in turn ON loss occur.

To address these problems, on a circuit, a Schottky barrier diode (SBD) is connected in parallel to a MOSFET and at the time of flyback, current flows in the SBD and does not flow in the parasitic pn diode. Nonetheless, cost increases because the number of SBD chips required is about equal to the number of MOSFETs.

Therefore, the SBD has to be connected to the n-type drift layer and the source electrode. Thus, a technique has been proposed in which a contact trench penetrating a p-type channel part in a substrate surface is formed, a SBD is enclosed in a trench inner wall, and current at the time of flyback flows to the built-in SBD and not the PiN diode (for example, refer to Japanese Laid-Open Patent Publication No. H8-204179).

FIG. 10 is a cross-sectional view of a structure of a conventional silicon carbide semiconductor device having a built-in SBD. As depicted in FIG. 10, at a front surface of an n$^+$-type silicon carbide substrate 102, a trench-type gate structure and a trench SBD 1032 are provided. In particular, on the n$^+$-type silicon carbide substrate 102, an n$^-$-type layer constituting the n$^-$-type drift layer 101 is formed by epitaxial growth, and at a front surface (surface facing toward the n$^-$-type drift layer 101) side of the n$^+$-type silicon carbide substrate 102, a MOS gate structure is provided, constituted by the p-type base layer 1016, the n$^+$-type source region 1017, the trench gate 1031, the gate insulating film 1019, and the gate electrode 1020.

The trench SBD 1032 is a trench in which an inner wall is covered by a Schottky metal connected with the source electrode 1022, and a Schottky contact of the Schottky metal and a semiconductor region exposed at the inner wall is formed. In this manner, in FIG. 10, a parasitic Schottky diode (built-in SBD) is provided in parallel to the parasitic pn diode between the source and the drain.

When positive voltage is applied to the source electrode 1022 and negative voltage is applied to a drain electrode (not depicted) provided at a rear surface of the n$^+$-type silicon carbide substrate 102 (OFF state of MOSFET), a pn junction between the p-type base layer 1016 and the n⁻-type drift layer 101 is forward biased. In FIG. 10, design is such that during the OFF state of the MOSFET, the parasitic Schottky diode turns ON before the parasitic pn diode turns ON. As a result, bipolar operation of the parasitic pn diode is suppressed, enabling aging due to bipolar operation to be prevented.

Further, according to another technique, in a silicon carbide semiconductor device having a contact trench with a Schottky electrode formed in Schottky contact, to improve breakdown voltage, a p-type layer is provided at a bottom of the contract trench (for example, refer to Japanese Laid-Open Patent Publication No. 2014-017469).

SUMMARY

According to an embodiment, a semiconductor device includes a semiconductor substrate of a first conductivity type; a first semiconductor layer of the first conductivity type provided on a front surface of the semiconductor substrate and having an impurity concentration that is lower than an impurity concentration of the semiconductor substrate; a plurality of first semiconductor regions of a second conductivity type selectively provided in the first semiconductor layer; a second semiconductor layer of the second conductivity type provided on a first side of the first semiconductor layer, opposite a second side of the first semiconductor layer facing toward the semiconductor substrate; a second semiconductor region of the first conductivity type selectively provided in the second semiconductor layer and having an impurity concentration that is higher than the impurity concentration of the semiconductor substrate; a first trench penetrating the second semiconductor region and the second semiconductor layer, and reaching the first semiconductor layer, a bottom of the first trench being in contact with a first first-semiconductor-region of the plurality of first semiconductor regions; a second trench penetrating the second semiconductor layer and reaching the first semiconductor layer, a bottom of the second trench being in contact with a second first-semiconductor-region of the plurality of first semiconductor regions; a gate electrode provided in the first trench, via a gate insulating film; and a Schottky electrode provided in the second trench. The plurality of first semiconductor regions are provided with an interval therebetween along a width direction of the first trench, in a region opposing, in a depth direction, a gate electrode pad connected to the gate electrode.

In the embodiment, the semiconductor device further includes a fourth semiconductor region of the first conductivity type provided between first semiconductor regions of the plurality of first semiconductor regions, the fourth semiconductor region having an impurity concentration that is higher than the impurity concentration of the first semiconductor layer.

In the embodiment, the semiconductor device further includes a fifth semiconductor region of the first conductivity type provided between the second semiconductor layer and the plurality of first semiconductor regions, the fifth semiconductor region having an impurity concentration that is higher than the impurity concentration of the first semiconductor layer.

In the embodiment, the semiconductor device further includes a third semiconductor region of the second conductivity type selectively provided at a surface on the first side of the first semiconductor layer.

In the embodiment, the second semiconductor layer is connected to the plurality of first semiconductor regions.

In the embodiment, the plurality of first semiconductor regions and the second semiconductor region are provided at an end of the first trench and an end of the second trench.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a top view of the structure of the silicon carbide semiconductor device according to the embodiment;

FIG. 4 is a cross-sectional view of the silicon carbide semiconductor device according to the embodiment during manufacture;

FIG. 6A is a cross-sectional view of the silicon carbide semiconductor device according to the embodiment during manufacture;

FIG. 6B is a cross-sectional view of the silicon carbide semiconductor device according to the embodiment during manufacture;

FIG. 7 is a cross-sectional view of the silicon carbide semiconductor device according to the embodiment during manufacture;

FIG. 8 is a cross-sectional view of the silicon carbide semiconductor device according to the embodiment during manufacture;

FIG. 9 is a cross-sectional view of a structure of a conventional silicon carbide semiconductor device;

FIG. 15 is a top view of a structure of the connection region and the gate pad region of the conventional silicon carbide semiconductor device having a built-in SBD.

DESCRIPTION OF EMBODIMENTS

Figure 11:
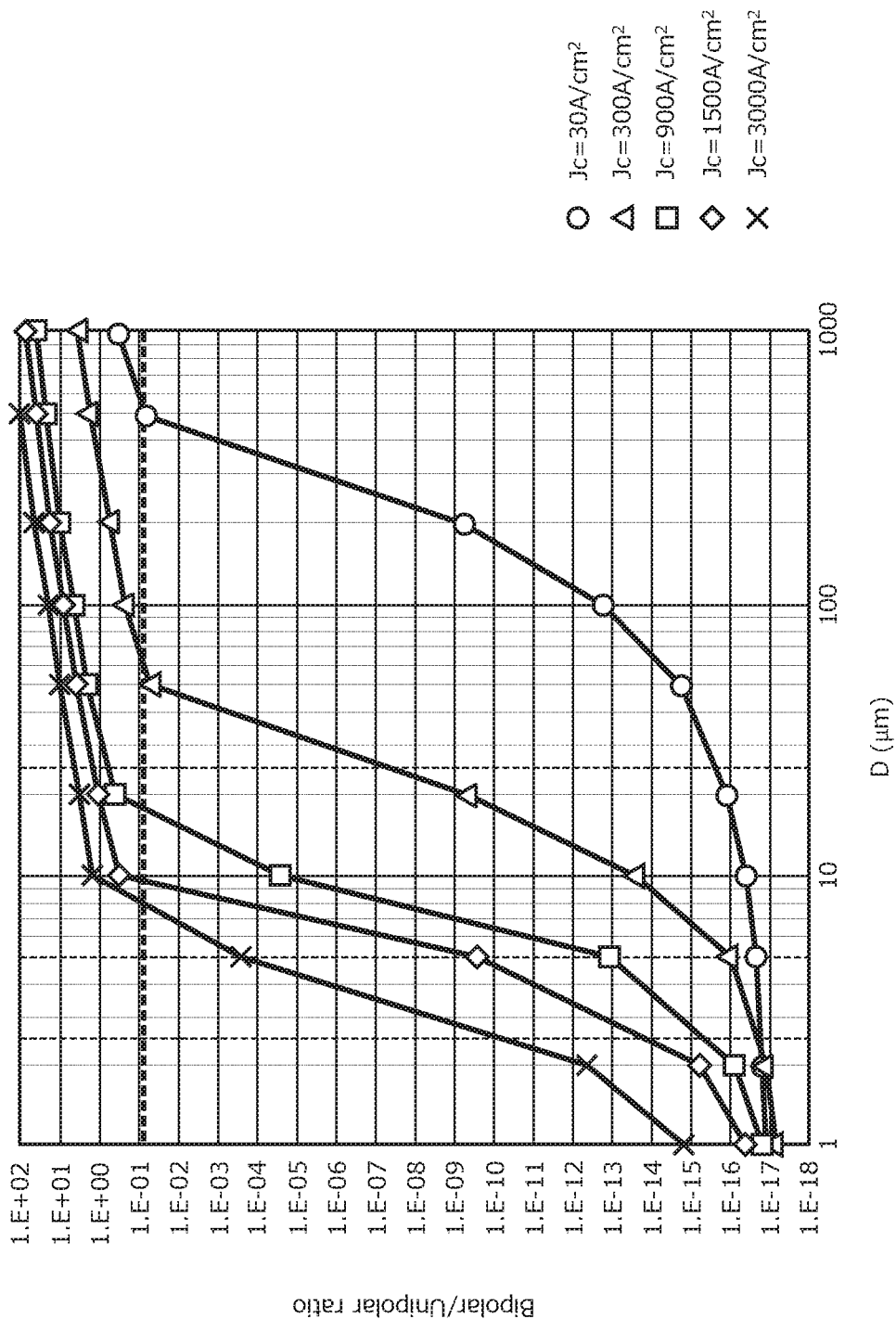
FIG. 11 is a graph depicting a relationship of bipolar current and a distance between a SBD and a PiN diode.

First, problems associated with the conventional techniques will be described. Here, a distance between the built-in SBD and a PiN diode (parasitic pn diode) increases and when resistance during forward application between the built-in SBD and the PiN diode is high, bipolar current tends to flow in the PiN diode. FIG. 11 is a graph depicting a relationship of bipolar current and the distance between the SBD and the PiN diode. In FIG. 11, a horizontal axis represents the distance D between the built-in SBD and the PiN diode in units of μm; and a vertical axis represents a ratio (Bipolar/Unipolar ratio, hereinafter, B/U) of current flowing in the PiN diode with respect to current flowing in a built-in SBD part. Further, FIG. 11 depicts measurement results when a collector current density Jc is varied between 30 to 3000 A/cm$^2$.

As depicted in FIG. 11, it is found that the greater is the distance D between the built-in SBD and the PiN diode, the greater is the B/U, and the PiN diode performs bipolar operation and the bipolar current flowing in the PiN diode increases. Further, it is found that the greater is the collector current density Jc, i.e., the higher is resistance during forward application between the built-in SBD and the PiN diode, PiN diode performs bipolar operation and the greater is the bipolar current flowing in the PiN diode.

Figure 12:
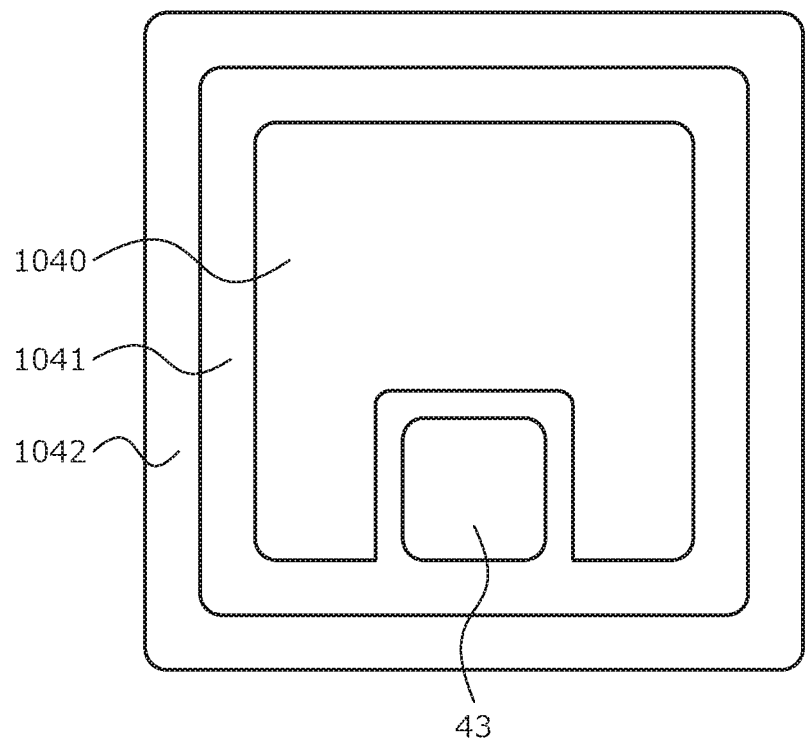
FIG. 12 is a top view of a structure of a conventional silicon carbide semiconductor device having a built-in SBD.

FIG. 12 is a top view of a structure of a conventional silicon carbide semiconductor device having a built-in SBD. The silicon carbide semiconductor device is constituted by an active region 1040 through which current flows when an element structure is formed and is in the ON state, an edge region 1042 surrounding the active region 1040 and maintaining the breakdown voltage, a connection region 1041 between the active region 1040 and the edge region 1042, a gate pad region 1043 electrically connected with a gate electrode. Further, FIG. 13 is a top view depicting arrangement of a SBD and a PiN diode of a conventional silicon carbide semiconductor device having a built-in SBD.

Figure 13:
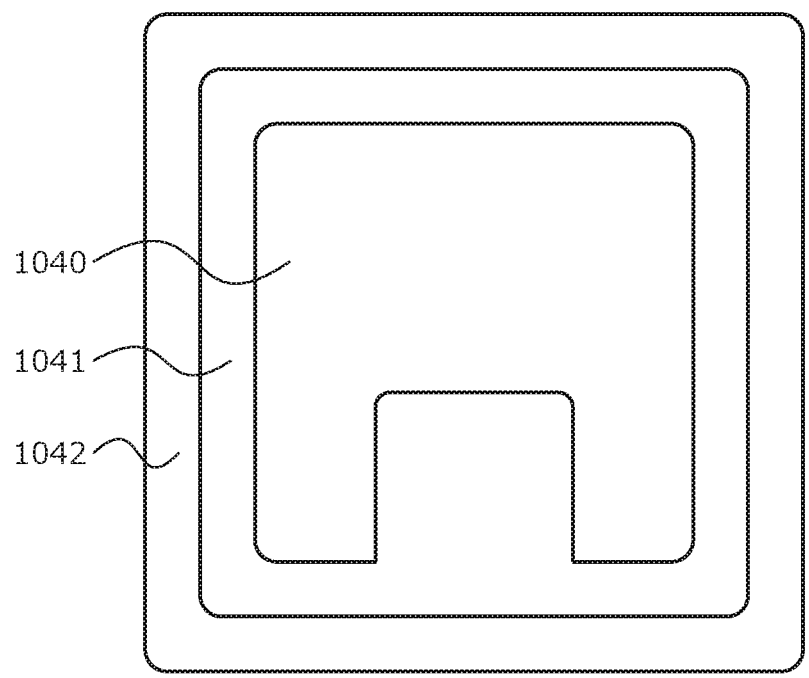
FIG. 13 is a top view depicting arrangement of a SBD and a PiN diode of a conventional silicon carbide semiconductor device having a built-in SBD.

From FIGS. 12 and 13, it is found that the SBD is present in the active region 1040, and the PiN diode is present in the active region 1040, the connection region 1041, and the gate pad region 1043. Therefore, in the active region 1040, the distance between the SBD and the PiN diode is not large. Nonetheless, in the connection region 1041 and the gate pad region 1043, the SBD is not present and therefore, the distance between the PiN diode and the SBD in the active region 1040 may become large.

Figure 9:
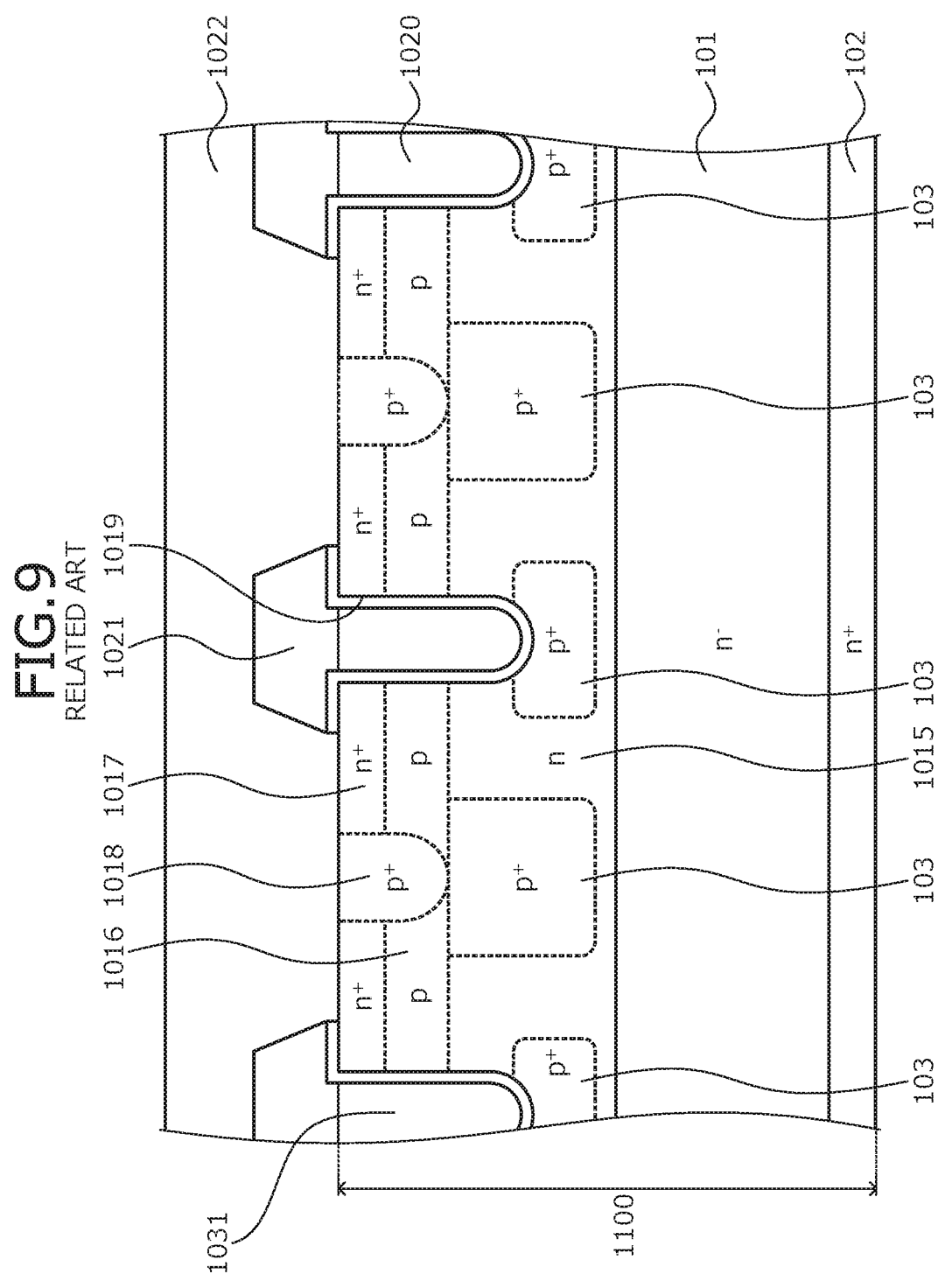
Figure 14:
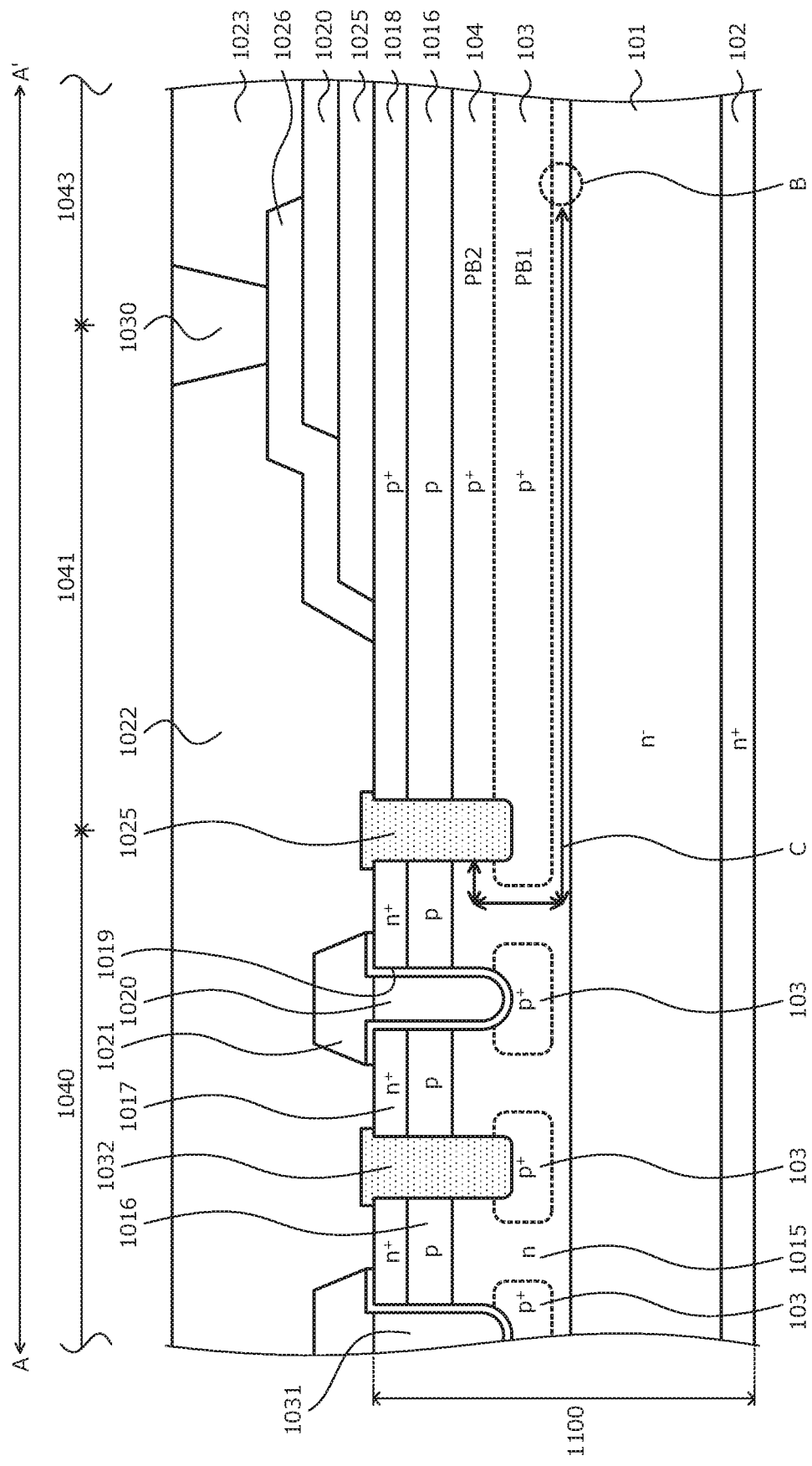
FIG. 14 is a cross-sectional view of a part at cutting line A-A' in FIG. 15 depicting a structure of an active region, a connection region, and a gate pad region of a conventional silicon carbide semiconductor device having a built-in SBD.

FIG. 14 is a cross-sectional view of a part at cutting line A-A' in FIG. 15 depicting a structure of the active region, the connection region, and the gate pad region of the conventional silicon carbide semiconductor device having a built-in SBD. FIG. 15 is a top view of a structure of the connection region and the gate pad region of the conventional silicon carbide semiconductor device having a built-in SBD. In FIG. 14, a part of the gate pad region 1043 is similar to the silicon carbide semiconductor device depicted in FIG. 9.

On the other hand, in the connection region 1041 and the gate pad region 1043, a second p$^+$-type region 104 is provided at a surface of the first p$^+$-type region 103, and on the second p$^+$-type region 104, the p-type base layer 1016 and the p$^+$-type contact region 1018 are sequentially provided. In such a structure, at a part of the PiN diode indicated by reference character B, a distance to the SBD is large and further current flows along a path indicated by arrows C. On this path, current flows for a long distance at a part where resistance is high beneath the first p$^+$-type region 103 and therefore, the resistance tends to increase. As a result, voltage is applied to the PiN diode indicated by reference character B and the PiN diode tends to perform bipolar operation. Further, as depicted in FIG. 11, the greater is Jc, the greater is the bipolar current and therefore, a problem arises in that in a large current region, bipolar current flows in the PiN diode of the gate pad region 1043, and forward direction degradation and loss at turn ON of the semiconductor device increase.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
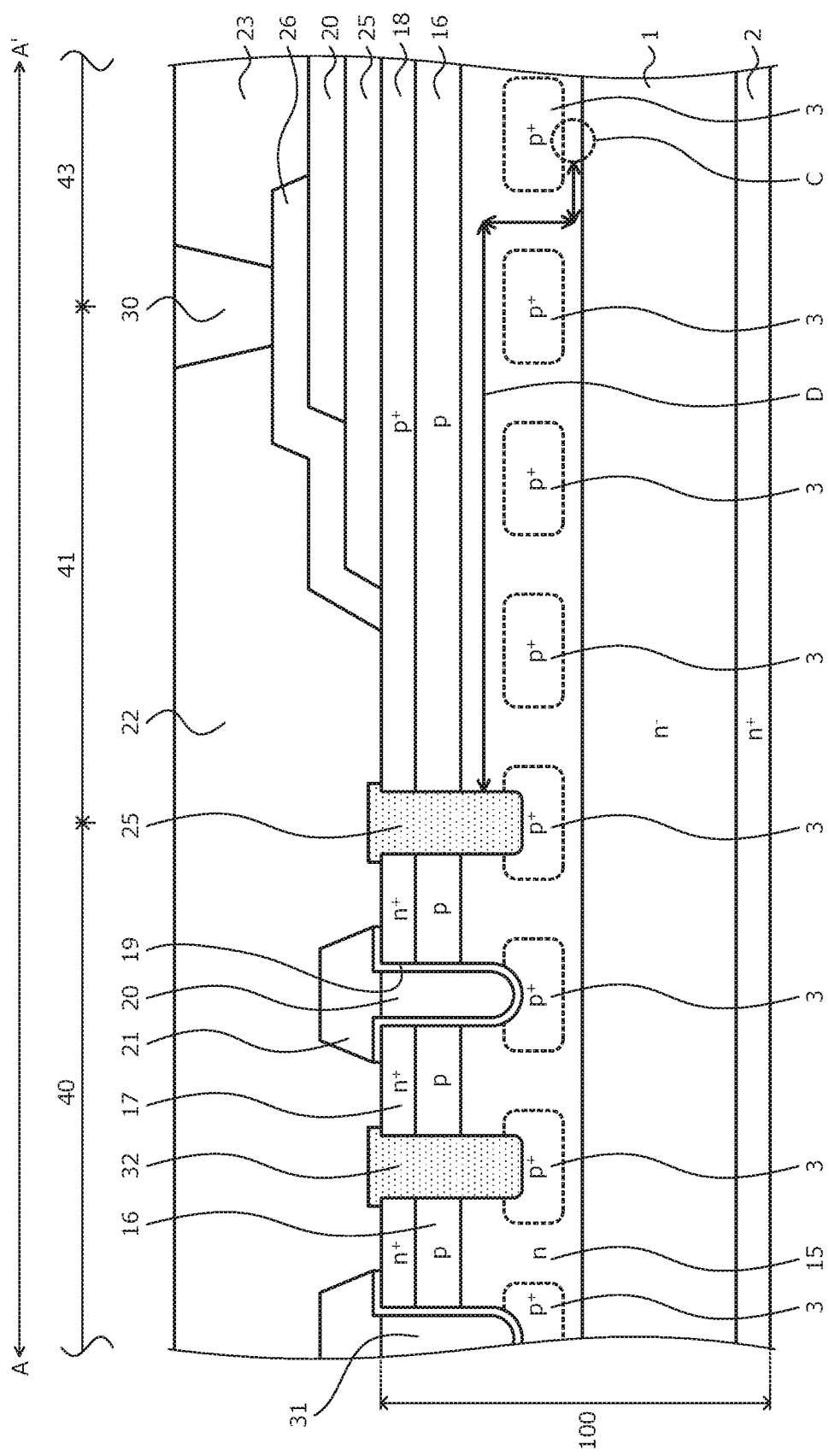
FIG. 1 is a cross-sectional view of a part of a structure of a silicon carbide semiconductor device according to an embodiment, at cutting line A-A' in FIG. 3.
Figure 2:
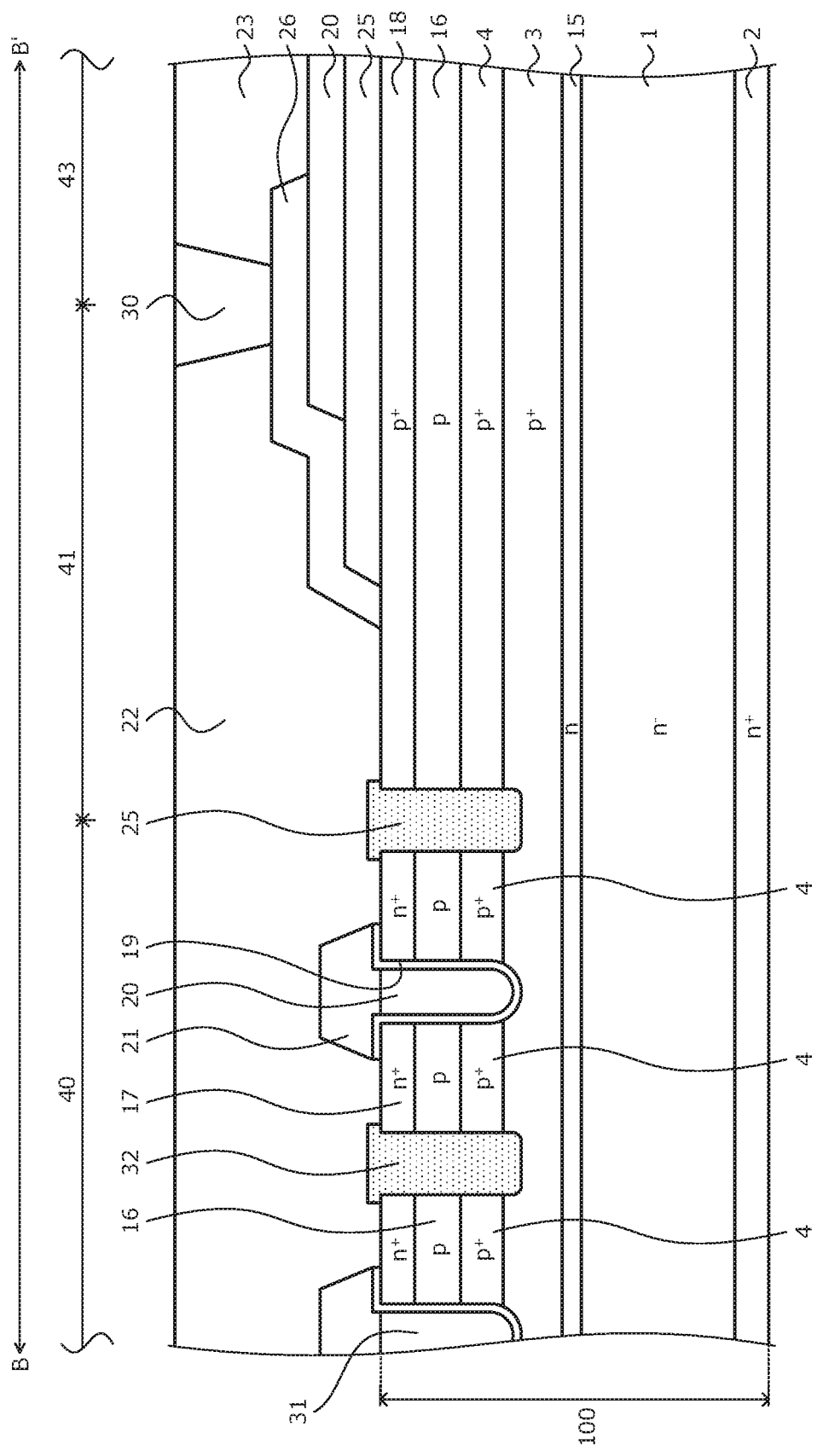
FIG. 2 is a cross-sectional view of a part the structure of the silicon carbide semiconductor device according to the embodiment, at cutting line B-B' in FIG. 3.

The semiconductor device according to an embodiment of the present invention is configured using a semiconductor material (hereinafter, wide bandgap semiconductor material) having a bandgap wider than that of silicon. Here, description will be given taking, as an example, a structure of a semiconductor device (silicon carbide semiconductor device) that uses, for example, silicon carbide (SiC) as a wide bandgap semiconductor material. FIG. 1 is a cross-sectional view of a part of a structure of the silicon carbide semiconductor device according to the embodiment, at cutting line A-A' in FIG. 3. Further, FIG. 2 is a cross-sectional view of a part the structure of the silicon carbide semiconductor device according to the embodiment, at cutting line B-B' in FIG. 3. FIG. 3 is a top view of the structure of the silicon carbide semiconductor device according to the embodiment. In FIGS. 1 to 3, only two unit cells (constituent unit of an element) are depicted and other unit cells adjacent to these are not depicted. The silicon carbide semiconductor device according to the embodiment depicted in FIGS. 1 to 3 is a MOSFET that includes a MOS gate at a front surface (surface at which a p-type base layer 16 is provided) side of a semiconductor base (silicon carbide base: semiconductor chip) 100 containing silicon carbide.

The semiconductor device according to an embodiment of the present invention is configured using a semiconductor material (hereinafter, wide bandgap semiconductor material) having a bandgap wider than that of silicon. Here, description will be given taking, as an example, a structure of a semiconductor device (silicon carbide semiconductor device) that uses, for example, silicon carbide (SiC) as a wide bandgap semiconductor material. FIG. 1 is a cross-sectional view of a part of a structure of the silicon carbide semiconductor device according to the embodiment, at cutting line A-A' in FIG. 3. Further, FIG. 2 is a cross-sectional view of a part the structure of the silicon carbide semiconductor device according to the embodiment, at cutting line B-B' in FIG. 3. FIG. 3 is a top view of the structure of the silicon carbide semiconductor device according to the embodiment. In FIGS. 1 to 3, only two unit cells (constituent unit of an element) are depicted and other unit cells adjacent to these are not depicted. The silicon carbide semiconductor device according to the embodiment depicted in FIGS. 1 to 3 is a MOSFET that includes a MOS gate at a front surface (surface at which a p-type base layer 16 is provided) side of a semiconductor base (silicon carbide base: semiconductor chip) 100 containing silicon carbide.

The silicon carbide base 100 is formed by sequentially forming by epitaxial growth on an n$^+$-type starting substrate (semiconductor substrate of a first conductivity type) 2 containing silicon carbide, silicon carbide layers constituting an n$^−$-type drift layer (first semiconductor layer of the first conductivity type) 1 and the p-type base layer (second semiconductor layer of a second conductivity type) 16. In an active region 40, the MOS gate includes the p-type base layer 16, an n$^+$-type source region (first semiconductor region of the first conductivity type) 17, a trench gate 31, a gate insulating film 19, and a gate electrode 20. In particular, in a surface layer of the n$^-$-type drift layer 1, on a source side (side toward a source electrode 22) of the n$^-$-type drift layer 1, an n-type region 15 is provided so as to be in contact with the p-type base layer 16. The n-type region 15 is a so-called current spreading layer (CSL) that reduces carrier spreading resistance. The n-type region (fourth semiconductor region of the first conductivity type) 15, for example, is uniform along a direction parallel to a base front surface (front surface of the silicon carbide base 100).

In the n-type region 15, a first p$^+$-type region (first semiconductor region of the second conductivity type) 3 and a second p$^+$-type region (second semiconductor region of the second conductivity type) 4 are selectively provided. In the active region 40, first p$^+$-type regions 3 are provided so as to be in contact with bottoms of a later-described trench gate (first trench) 31 and a trench SBD (second trench) 32. The first p$^+$-type regions 3 are provided at a depth not reaching an interface of the n-type region 15 and the n$^-$-type drift layer 1, from a deep position closer to a drain than is an interface of the p-type base layer 16 and the n-type region 15. Provision of the first p$^+$-type regions 3 enables a pn junction between the first p$^+$-type region 3 and the n-type region 15 to be formed near the bottoms of the trench gate 31 and the trench SBD 32. The first p$^+$-type regions 3 have an impurity concentration that is higher than an impurity concentration of the p-type base layer 16.

Further, at a connection region 41 and a gate pad region 43, the first p$^+$-type regions 3 are thinned out and partially provided. Therefore, along a width direction of the trench gate 31 and the trench SBD 32, between the first p$^+$-type regions 3 are intervals and in these intervals, the n-type region 15, which has an impurity concentration higher than an impurity concentration of the n$^-$-type drift layer 1, is provided. With such a structure, in a part of the PiN diode indicated by reference character C, current flows along a path indicated by arrows D. A distance of this path to the trench SBD 32 is shorter than a path of arrows C in FIG. 14 and flows through a part of low resistance on the first p$^+$-type region 3, enabling the resistance to be reduced. Therefore, voltage is not easily applied to the PiN diode indicated by reference character C, suppressing bipolar operation.

Further, the second p$^+$-type region 4 is a region that extends a part of the first p$^+$-type region 3 upward (direction opposite that of a depth of the trench gate 31) and is connected to the p-type base layer 16. As a result, holes generated when avalanche breakdown occurs at junction part of the first p$^+$-type region 3 and the n-type region 15, are efficiently migrated to the source electrode 22, enabling load on the gate insulating film 19 to be reduced and reliability to be increased.

Here, FIG. 1 is a cross-sectional view of a part in which the second p$^+$-type region 4 is not provided. FIG. 2 is a cross-sectional view of a part in which the second p$^+$-type region 4 is provided. The second p$^+$-type region 4 is selectively provided separated from the n$^-$-type drift layer 1 and in contact with the first p$^+$-type region 3. In interface of the first p$^+$-type region 3 and the second p$^+$-type region 4 is provided closer toward an upper side than are the bottoms of the trench gate 31 and the trench SBD 32. The upper side is a side toward the source electrode 22.

Further, at a part where the second p$^+$-type region 4 is provided, the second p$^+$-type regions 4 extend along a width direction (direction parallel to the trench gate 31) of the trench gate 31 so as to connect each. Further, in FIG. 3, a region E indicated by heavy hatching is a region in which the first p$^+$-type region 3 and the second p$^+$-type region 4 are provided, and a region F indicated by light hatching is a region in which only the first p$^+$-type region 3 is provided. As depicted in FIG. 3, at an end G of the trench gate 31 and an end H of the trench SBD 32, the first p$^+$-type region 3 and the second p$^+$-type region 4 are provided. The ends are parts at each end of the trench gate 31 and the trench SBD 32, which have a striped shape. As a result, concentration of electric field at the end G of the trench gate 31 and the end H of the trench SBD 32 may be mitigated.

Further, in the p-type base layer 16, the n$^+$-type source region 17 and the p$^+$-type contact region 18 are each selectively provided so as to be in contact with each other. A depth of the p$^+$-type contact region 18 may be, for example, equal to a depth of the n$^+$-type source region 17, or may be deeper than the depth of the n$^+$-type source region 17.

The trench gate 31 penetrates the n$^+$-type source region 17 and the p-type base layer 16 from the base front surface and reaches the n-type region 15. In the trench gate 31, the gate insulating film 19 is provided along an inner wall of the trench gate 31 and the gate electrode 20 is provided on the gate insulating film 19. An end of the gate electrode 20 toward the source side may or may not protrude from the base front surface. The gate electrode 20 is electrically connected to a gate electrode pad 23 by the gate pad region 43. An interlayer insulating film 21 is provided at the base front surface overall so as to cover the gate electrode 20 embedded in the trench gate 31.

The trench SBD 32 penetrates the n$^+$-type source region 17 and the p-type base layer 16 from the base front surface and reaches the n-type region 15. In the trench SBD 32, an inner wall of the trench SBD 32 is covered by a Schottky metal connected with the source electrode 22, whereby a Schottky junction of the Schottky metal and a semiconductor region exposed at the inner wall is formed. Further, an oxide film 25, for example, silicon dioxide ($SiO_2$), is provided on the Schottky metal.

The source electrode 22 is in contact with the n$^+$-type source region 17 and the p$^+$-type contact region 18, via a contact hole opened in the interlayer insulating film 21, and is electrically insulated from the gate electrode 20 by the interlayer insulating film 21. Between the source electrode 22 and the interlayer insulating film 21, for example, a barrier metal may be provided that prevents diffusion of metal atoms from the source electrode 22 toward the gate electrode 20. On the source electrode 22, a source electrode pad (not depicted) is provided. At a rear surface (rear surface of the n$^+$-type silicon carbide substrate 2 constituting an n$^+$-type drain region) of the silicon carbide base 100, a drain electrode (not depicted) is provided.

In the connection region 41 and the gate pad region 43, at a first main surface side (side at which the p-type base layer 16 is provided) of a silicon carbide semiconductor base, the oxide film 25 is provided. At an upper side of the oxide film 25, the gate electrode 20 of a gate pad lower part is provided, and on the gate electrode 20 of the gate pad lower part, the gate electrode pad 23 is provided. Further, the source electrode 22 and the gate electrode pad 23 are insulated by an oxide film 26 and an insulator 30.

A method of manufacturing the semiconductor device according to the embodiment will be described. FIGS. 4, 5A, 5B, 6A, 6B, 7, and 8 are cross-sectional views of the silicon carbide semiconductor device according to the embodiment during manufacture. First, the n$^+$-type silicon carbide substrate 2 constituting the n⁺-type drain region is prepared. Next, on a front surface of the n⁺-type silicon carbide substrate 2, the n⁻-type drift layer 1 is formed by epitaxial growth. For example, conditions of the epitaxial growth for forming the n⁻-type drift layer 1 may be set so that the impurity concentration of the n⁻-type drift layer 1 becomes about $3\times10^{15}/cm^3$. The state up to here is depicted in FIG. 4.

Figure 5A:
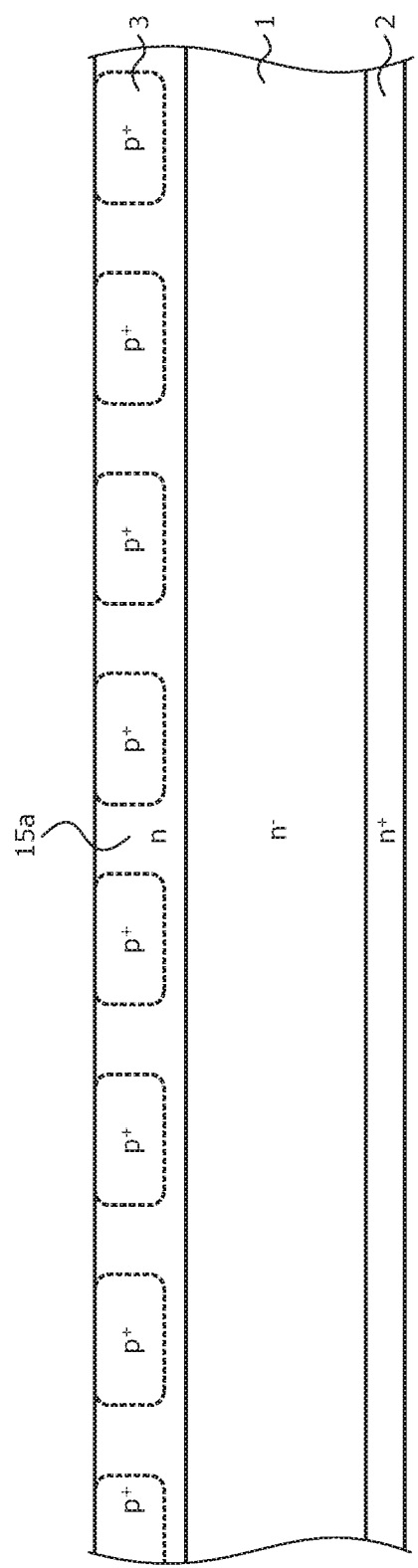
FIG. 5A is a cross-sectional view of the silicon carbide semiconductor device according to the embodiment during manufacture.
Figure 5B:
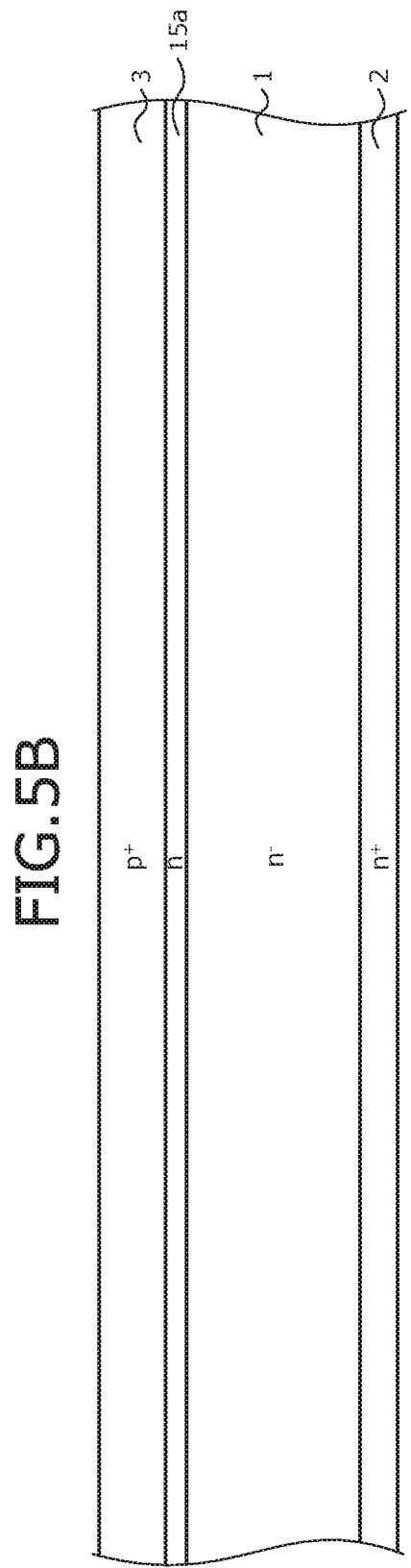
FIG. 5B is a cross-sectional view of the silicon carbide semiconductor device according to the embodiment during manufacture.
Figure 10:
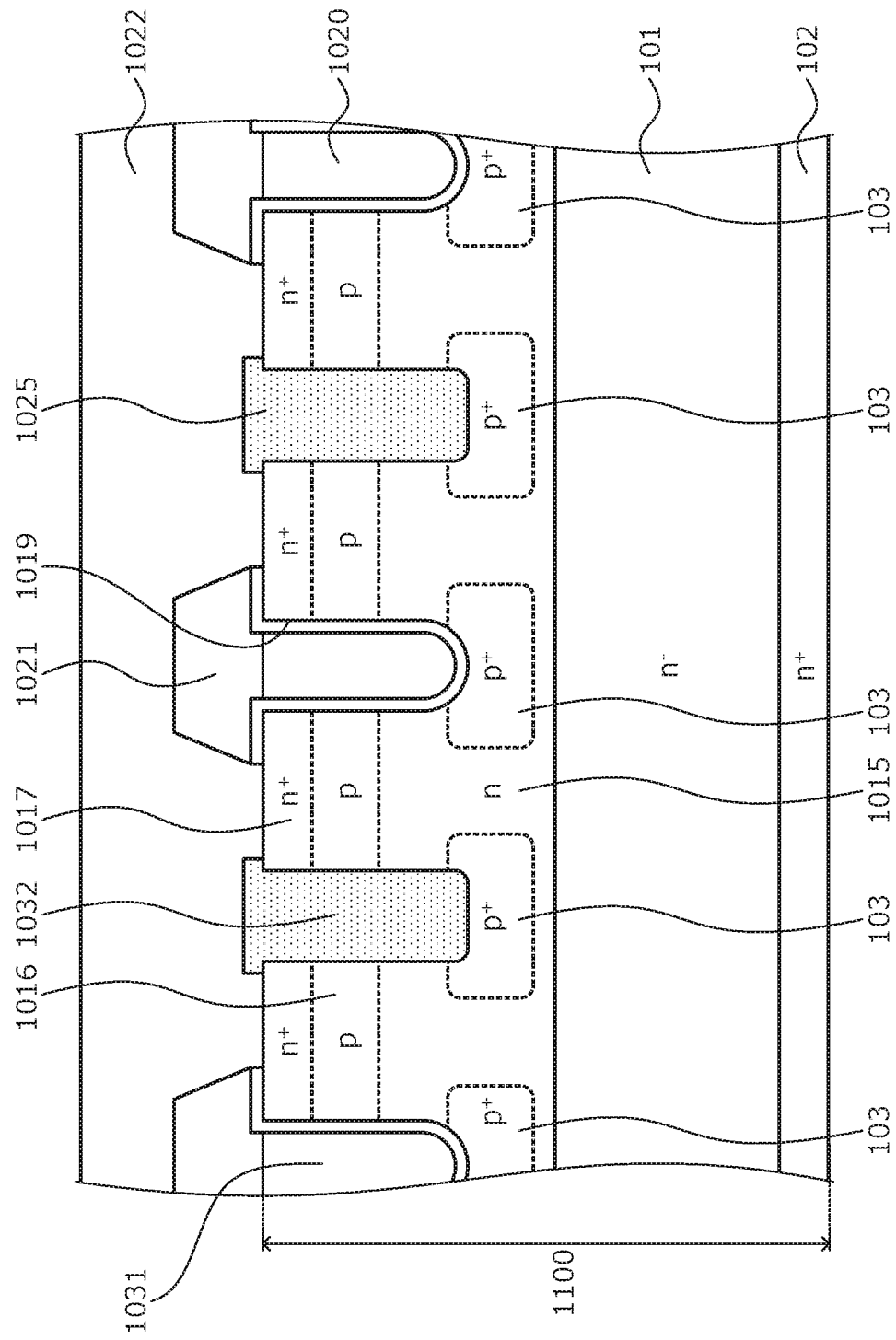
FIG. 10 is a cross-sectional view of a structure of a conventional silicon carbide semiconductor device having a built-in SBD.

Next, on the n⁻-type drift layer 1, a lower n-type region 15a is formed by epitaxial growth. For example, conditions of the epitaxial growth for forming the lower n-type region 15a may be set so that an impurity concentration of the lower n-type region 15a becomes about $1\times10^{17}/cm^3$. The lower n-type region 15a is a part of the n-type region 15. Next, by photolithography and ion implantation of a p-type impurity, in a surface layer of the lower n-type region 15a, the first p⁺-type region 3 is selectively formed. For example, a dose amount of the ion implantation for forming the first p⁺-type region 3 may be set so that the impurity concentration of the first p⁺-type region 3 becomes about $5\times10^{18}/cm^3$. The state up to here is depicted in FIGS. 5A and 5B. Here, FIG. 5A is a cross-sectional view of a part at cutting line A-A' depicted in FIG. 3 and FIG. 5B is a cross-sectional view of a part at cutting line B-B' depicted in FIG. 3.

Next, on the lower n-type region 15a and the first p⁺-type region 3, an upper n-type region 15b is formed by epitaxial growth. For example, conditions of the epitaxial growth for forming the upper n-type region 15b may be set so that an impurity concentration of the upper n-type region 15b becomes about equal to the impurity concentration of the lower n-type region 15a. The upper n-type region 15b is a part of the n-type region 15. The lower n-type region 15a and the upper n-type region 15b combined form the n-type region 15. Next, by photolithography and ion implantation of a p-type impurity, in a surface layer of the upper n-type region 15b, the second p⁺-type region 4 is selectively formed. For example, a dose amount of the ion implantation for forming the second p⁺-type region 4 may be set so that an impurity concentration of the second p⁺-type region 4 becomes about equal to the impurity concentration of the first p⁺-type region 3. The state up to here is depicted in FIGS. 6A and 6B. Here, FIG. 6A is a cross-sectional view of a part at cutting line A-A' depicted in FIG. 3 and FIG. 6B is a cross-sectional view of a part at cutting line B-B' depicted in FIG. 3.

Next, on the upper n-type region 15b and the second p⁺-type region 4, the p-type base layer 16 is formed by epitaxial growth. For example, conditions of the epitaxial growth for forming the p-type base layer 16 may be set so that the impurity concentration of the p-type base layer 16 becomes about $4\times10^{17}/cm^3$. Parts formed hereinafter are common to both cross-sections of parts at cutting lines A-A' and B-B' and therefore, only a cross-sectional view of a part at cutting line A-A' in FIG. 3 is depicted.

Next, by photolithography and ion implantation of an n-type impurity, the n⁺-type source region 17 is selectively formed in a surface layer of the p-type base layer 16. For example, a dose amount of the ion implantation for forming the n⁺-type source region 17 may be set so that an impurity concentration of the n⁺-type source region 17 becomes about $3\times10^{20}/cm^3$.

Next, by photolithography and ion implantation of a p-type impurity, the p⁺-type contact region 18 is selectively formed in the surface layer of the p-type base layer 16 so as to be in contact with the n⁺-type source region 17. For example, a dose amount of the ion implantation for forming the p⁺-type contact region 18 may be set so that an impurity concentration of the p⁺-type contact region 18 becomes about $3\times10^{20}/cm^3$. A sequence of formation of the n⁺-type source region 17 and the p⁺-type contact region 18 may be interchanged. After all ion implantations are completed, activation annealing is performed. The state up to here is depicted in FIG. 7.

Next, by photolithography and etching, the trench gate 31 is formed penetrating the n⁺-type source region 17 and the p-type base layer 16, and reaching the n-type region 15. The bottom of the trench gate 31 may reach the first p⁺-type region 3, or may be positioned in the n-type region 15, between the p-type base layer 16 and the first p⁺-type region 3. Subsequently, a mask used for forming the trench gate 31 is removed. Further, an oxide film is used as the mask during trench formation. After trench etching, isotropic etching for removing damage of the trench gate 31 and/or hydrogen annealing for rounding corners of the bottom and opening of the trench gate 31 may be performed. Any one of the isotropic etching and the hydrogen annealing may be performed. Alternatively, after the isotropic etching, the hydrogen annealing may be performed.

Next, by photolithography and etching, the trench SBD 32 is formed penetrating the n⁺-type source region 17 and the p-type base layer 16, and reaching the n-type region 15. The bottom of the trench SBD 32 may reach the first p⁺-type region 3, or may be positioned in the n-type region 15, between the p-type base layer 16 and the first p⁺-type region 3. Subsequently, a mask used for forming the trench SBD 32 is removed. The state up to here is depicted in FIG. 8.

Next, the gate insulating film 19 is formed along the front surface of the silicon carbide base 100 and the inner wall of the trench gate 31. Next, for example, poly-silicon is deposited and etched so as to be embedded in the trench gate 31, whereby the poly-silicon constituting the gate electrode 20 is left in the trench gate 31. At this time, etching may be performed so that the poly-silicon remains inside below a base surface part, or patterning and etching may be performed, whereby the poly-silicon protrudes outside from the base surface part.

Next, along the inner wall of the trench SBD 32, a metal film is formed of, for example, titanium (Ti). Next, for example, heat treatment (annealing) is performed in a nitrogen (N₂) atmosphere at a temperature of about 500 degrees C. or less, whereby a Schottky junction of a semiconductor region and the metal film is formed at the inner wall of the trench SBD 32.

Next, the interlayer insulating film 21 is formed at the front surface of the silicon carbide base 100 overall so as to cover the gate electrode 20. The interlayer insulating film 21 may be formed by, for example, a non-doped silicate glass (NSG), a phosphosilicate glass (PSG), a borophosphosilicate glass (BPSG), a high temperature oxide (HTO), or a combination thereof. Next, the interlayer insulating film 21 and the gate insulating film 19 are patterned and a contact hole is formed, exposing the n⁺-type source region 17 and the p⁺-type contact region 18.

Next, a barrier metal formed and patterned so as to cover the interlayer insulating film 21 and again expose the n⁺-type source region 17 and the p⁺-type contact region 18. Next, the source electrode 22 is formed so as to be in contact with the n⁺-type source region 17. The source electrode 22 may be formed so as to cover the barrier metal, or may be left only in the contact hole.

Next, the source electrode pad is formed so as to be embedded in the contact hole. A part of a metal layer deposited to form the source electrode pad may be used as a gate pad. At the rear surface of the n⁺-type silicon carbide substrate 2, a metal film such as a nickel (Ni) film, a titanium (Ti) film, etc. is formed at a contact part of the drain electrode (not depicted) by sputtering deposition, etc. The metal film may be a stacked combination of one or more Ni films and Ti films. hereafter, annealing such as rapid thermal annealing (RTA), etc. is performed converting the metal film into a silicide and forming an ohmic contact. Thereafter, for example, a thick film such as a stacked film in which a Ti film, a Ni film, and a gold (Au) are sequentially stacked is formed by electron beam (EB) deposition, forming the drain electrode.

In the epitaxial growth and ion implantations above, as an n-type impurity (n-type dopant), for example, nitrogen (N), phosphorus (P), arsenic (As), antimony (Sb), etc. that are n-types with respect to silicon carbide is used. As a p-type impurity (p-type dopant), for example, boron (B), aluminum (Al), gallium (Ga), indium (In), thallium (Tl), etc. that are p-types with respect to silicon carbide is used. In this manner, the MOSFET depicted in FIGS. 1 and 2 is completed.

As described, according to the embodiment, in the gate pad region, the first $p^+$-type regions are thinned out and partially provided. As a result, current from the trench SBD to PiN diode flows through a part of a low resistance on the first $p^+$-type region, thereby enabling the resistance to be reduced. Voltage is not easily applied to the PiN diode of gate pad region and bipolar operation is suppressed. Therefore, degradation of forward voltage and loss at turn ON of the semiconductor device may be reduced.

In the embodiments of the present invention, various modifications within a range not departing from the spirit of the invention are possible. For example, dimensions, impurity concentrations, etc. of regions may be variously set according to required specifications. Further, in the embodiments, while description has been given taking a MOSFET as an example, without limitation hereto, wide application to various silicon carbide semiconductor devices in which conduction and shutoff of current is performed by gate driving control based on a predetermined gate threshold voltage is possible. As a silicon carbide semiconductor device under gate driving control, insulated gate bipolar transistor (IGBT) may be given as an example. Further, in the embodiments, while a case in which silicon carbide is used as a wide bandgap semiconductor material, application is possible to a wide bandgap semiconductor material other than silicon carbide such as gallium nitride (GaN). Further, in the embodiments, while the first conductivity type is assumed as an n-type and the second conductivity type is assumed as a p-type, the present invention is similarly implemented when the first conductivity type is a p-type and the second conductivity type is an n-type.

According to the embodiments of the present invention, in a gate pad region, the first $p^+$-type regions (first semiconductor regions of the second conductivity type) are thinned out and partially provided. As a result, current from the trench SBD to the PiN diode flows through a part of low resistance on the first $p^+$-type region, thereby enabling the resistance to be reduced. Voltage is not easily applied to the PiN diode of the gate pad region and bipolar operation is suppressed. Therefore, degradation of forward voltage and loss at turn ON of the semiconductor device may be reduced.

The semiconductor device according to the embodiments of the present invention achieves an effect in that degradation of forward voltage and loss at turn ON may be reduced without bipolar operation of the PiN diode, to a large voltage region.

As described, the semiconductor device according to the embodiments of the present invention is useful for power semiconductor devices used in power converting equipment, and power supply devices such as in various industrial machines, etc.; and is particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate of a first conductivity type;
    a first semiconductor layer of the first conductivity type provided on a front surface of the semiconductor substrate;
    a fourth semiconductor region of the first conductivity type provided on a first side of the first semiconductor layer, opposite a second side of the first semiconductor layer facing toward the semiconductor substrate, the fourth semiconductor region having an impurity concentration that is higher than an impurity concentration of the first semiconductor layer;
    a plurality of first semiconductor regions of a second conductivity type selectively provided in the fourth semiconductor region;
    a second semiconductor layer of the second conductivity type provided on a first side of the fourth semiconductor region, opposite a second side of the fourth semiconductor region facing toward the first semiconductor layer;
    a second semiconductor region of the first conductivity type selectively provided in the second semiconductor layer and having an impurity concentration that is higher than the impurity concentration of the semiconductor substrate;
    a first trench penetrating the second semiconductor region and the second semiconductor layer, and reaching the fourth semiconductor region, a bottom of the first trench being in contact with a first first-semiconductor-region of the plurality of first semiconductor regions;
    a second trench penetrating the second semiconductor layer and reaching the fourth semiconductor region, a bottom of the second trench being in contact with a second first-semiconductor-region of the plurality of first semiconductor regions;
    a gate electrode provided in the first trench, via a gate insulating film; and
    a Schottky electrode provided in the second trench, wherein
    the plurality of first semiconductor regions are provided with an interval therebetween along a width direction of the first trench, in a region opposing, in a depth direction, a gate electrode pad which is connected to the gate electrode and provided on a contact region via an oxide film and the gate electrode.

2. The semiconductor device according to claim 1, further comprising
    a fifth semiconductor region of the first conductivity type provided between the second semiconductor layer and the plurality of first semiconductor regions, the fifth semiconductor region having an impurity concentration that is higher than the impurity concentration of the first semiconductor layer.

3. The semiconductor device according to claim 1, further comprising
a third semiconductor region of the second conductivity type selectively provided at a surface on the first side of the fourth semiconductor region.

4. The semiconductor device according to claim 1, wherein
the second semiconductor layer is connected to the plurality of first semiconductor regions.

5. The semiconductor device according to claim 1, further comprising:
a plurality of third semiconductor regions of the second conductivity type selectively provided in the fourth semiconductor region,
wherein
the first first-semiconductor-region of the plurality of first semiconductor regions and a first third-semiconductor-region of the plurality of third semiconductor regions are provided at an end of the first trench, and
the second first-semiconductor-region of the plurality of first semiconductor regions and a second third-semiconductor-region of the plurality of third semiconductor regions are provided at an end of the second trench.

6. The semiconductor device according to claim 1, wherein
the plurality of first semiconductor regions include first semiconductor regions which are provided with the interval therebetween along the width direction of the first trench and are located in a gate pad region, the gate pad region including the gate electrode pad.

7. The semiconductor device according to claim 6, wherein
the gate pad region is adjacent to a connection region in the width direction of the first trench,
the connection region is disposed between an active region and the gate pad region, and
the connection region includes a source electrode, electrically insulated from the gate electrode and in contact with the contact region, the contact region being of the second conductivity type.

8. The semiconductor device according to claim 6, wherein
current flows along a path to the second trench, a portion of the path being provided above the first semiconductor regions which are provided with the interval therebetween along the width direction of the first trench and located in the gate pad region.

9. The semiconductor device according to claim 6, wherein
in a first portion of the gate pad region, only the first semiconductor regions are provided with the interval therebetween along the width direction of the first trench, and
in a second portion of the gate pad region, the first semiconductor regions are provided with the interval therebetween along the width direction of the first trench, together with a third semiconductor region of the second conductivity type which is selectively provided in an upper part of the fourth semiconductor region.

* * * * *